United States Patent [19]
Butash

[11] Patent Number: 5,867,479
[45] Date of Patent: Feb. 2, 1999

[54] DIGITAL MULTI-CHANNEL DEMULTIPLEXER/MULTIPLEX (MCD/M ARCHITECTURE)

[75] Inventor: Thomas C. Butash, Centreville, Va.

[73] Assignee: Lockheed Martin Corporation, Bethesda, Md.

[21] Appl. No.: 884,650

[22] Filed: Jun. 27, 1997

[51] Int. Cl.[6] ................................................ H04J 1/05
[52] U.S. Cl. .................. 370/210; 370/480; 364/724.16
[58] Field of Search .................................. 370/210, 343, 370/344, 260, 319, 203, 208, 480, 481, 484; 364/724.01, 725.03, 726.02, 724.16

[56] References Cited

U.S. PATENT DOCUMENTS

| | | | |
|---|---|---|---|
| 4,754,449 | 6/1988 | Crookshanks | 370/210 |
| 4,785,447 | 11/1988 | Ichiyoshi | 370/210 |
| 4,792,943 | 12/1988 | Gockler | 370/210 |
| 4,839,889 | 6/1989 | Gockler | 370/210 |
| 4,896,320 | 1/1990 | Gockler | 370/497 |
| 5,268,905 | 12/1993 | Soloff | 370/210 |
| 5,293,329 | 3/1994 | Wishart | 390/210 |
| 5,293,382 | 3/1994 | Carson et al. | 370/210 |
| 5,299,192 | 3/1994 | Guo et al. | 370/210 |
| 5,323,391 | 6/1994 | Harrison | 370/210 |
| 5,396,489 | 3/1995 | Harrison | 370/210 |
| 5,587,939 | 12/1996 | Soleyamni et al. | 364/724.16 |

Primary Examiner—Chau Nguyen
Assistant Examiner—Kenneth Vanderpuye
Attorney, Agent, or Firm—Lane, Aitken & McCann

[57] ABSTRACT

A digital signal processing system for multiplexing/demultiplexing a large number of closely spaced FDM channels in which sub-band definition filtering divides the FDM spectral band comprised of "N" channels into "K" sub-bands in order to reduce the dimension of the polyphase filter fast Fourier transform structure required to complete the multiplexing/demultiplexing. This reduces the order of the required prototype filter by a factor proportional to K. The number of sub-bands K is chosen so that it is large enough to ensure the polyphase filter, fast Fourier transform structure for each sub-band is realizable within a finite word length, fixed point arithmetic implementation compatible with a low power consumption. To facilitate efficient sub-band definition filtering, the real basebanded composite signal is inputted at a spectral offset from DC equal to one quarter the FDM channel bandwidth for the N channels and the signal is sampled at a frequency 50% greater than the applicable Nyquist rate. The quarter band spectral offset and oversampling by 50% above the theoretical Nyquist rate facilitate the use of computationally efficient bandshift and symmetric half-band Finite Impulse Response (FIR) filtering.

8 Claims, 9 Drawing Sheets

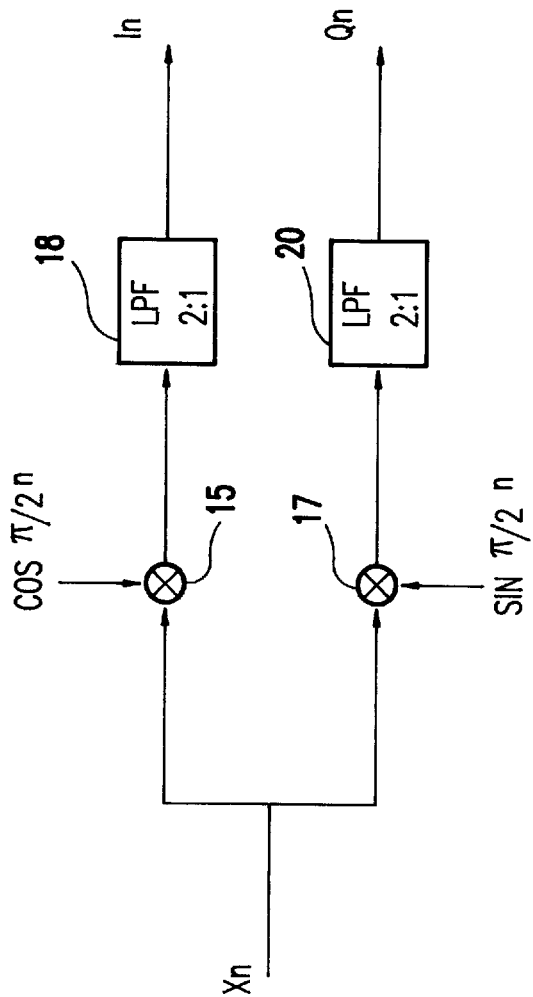

5,867,479

DIGITAL MULTI-CHANNEL DEMULTIPLEXER/MULTIPLEX (MCD/M ARCHITECTURE)

BACKGROUND OF THE INVENTION

1. Field of the Invention

This invention relates to an improved digital signal processing method and apparatus for demultiplexing and multiplexing frequency division multiplexed channels and more particularly, to a lightweight, compact, low power system which synthesizes a polyphased filter, fast Fourier transform architecture suitable for use in applications with a large number of channels.

2. Description of the Prior Art

In the prior art, digital polyphase filters (PPFs) are used in combination with fast Fourier transform (FFT) algorithms to efficiently demultiplex multiple, frequency division multiplexed (FDM) channels. Similarly, the polyphase filters are used in combination with inverse FFT algorithms to multiplex separate signals onto FDM channels. An N branch polyphase filter is realized by factoring (or partitioning) a desired prototype filter's transfer function (or impulse response) into N subfilters. When coupled with an N point FFT (or IFFT) as shown in FIGS. 1 and 2, an N branch PPF can be used to implement a bank of N bandpass, N:1 decimating (or 1:N interpolating) filters for demultiplexing (or multiplexing) up to N FDM channels. The MCD/M thus realized represents the most computationally efficient system known for both demultiplexing and multiplexing large numbers of FDM channels.

The minimum order necessary to synthesize the required polyphase prototype filter is dictated by the ratio of the guard frequency band (separating adjacent FDM channels) to channel center frequency spacing, filter passband gain uniformity, channel cross-talk attenuation requirements, and the number, N, of FDM channels to be either demultiplexed or multiplexed. Given a fixed guard band to channel spacing ratio and fixed filter response requirements, the minimum order of the polyphase prototype filter grows linearly with N.

Cellular, Personal Communication Systems (PCSs) and other emerging telecommunications applications continue to demand increasingly larger numbers of ever more closely packed FDM communications channels. Such systems (e.g., satellite based cellular systems) often place stringent constraints on the power, mass and physical dimensions of the digital MCD/M subsystem designed to generate the constituent FDM communications channels. These constraints necessitate the use of short sample word lengths (e.g., from 8 to 12 bits) and fixed point arithmetic in any practically realizable MCD/M system for these applications. Short sample word lengths and fixed point arithmetic are, however, inherently incompatible with accurate, high order prototype filter realizations. Indeed, in some applications, the indicated (higher order prototype) polyphase filter may not even be physically realizable within the finite word length and fixed point arithmetic dimensions necessary to meet the MCD/M subsystem's power, mass and size constraints.

BRIEF DESCRIPTION OF THE INVENTION

An object of this invention is the provision a computationally efficient digital signal processing system, which synthesizes a polyphase filter-fast Fourier transform or inverse fast Fourier transform combination to respectively demultiplex or multiplex a large number of closely spaced FDM channels. That is, the provision of such a digital signal processing system that can be implemented as a small size, lightweight, device with low power consumption for multiplexing and demultiplexing a large number of closely spaced FDM channels.

Briefly, this invention contemplates the provision of a digital signal processing system for multiplexing/demultiplexing a large number of closely spaced FDM channels in which sub-band definition filtering divides the FDM channel band comprised of "N" channels into "K" sub-bands in order to reduce the dimension of the polyphase filter-fast Fourier transform structure required to complete the multiplexing/demultiplexing. This reduces the order of the required prototype filter by a factor proportional to K. The number of sub-bands K is chosen so that it is large enough to ensure the polyphase filter-fast Fourier transform structure for each sub-band is realizable within a finite word length, fixed point arithmetic implementation compatible with a low power consumption. To facilitate efficient sub-band definition filtering, the real basebanded composite signal is inputted at a spectral offset from DC equal to one quarter the aggregate FDM channel bandwidth for the N channels and the signal is sampled at a frequency 50% greater than the applicable Nyquist rate. The quarter band spectral offset and oversampling by 50% above the theoretical Nyquist rate facilitate the use of computationally efficient bandshift and symmetric half-band Finite Impulse Response (FIR) filtering.

BRIEF DESCRIPTION OF THE DRAWINGS

The foregoing and other objects, aspects and advantages will be better understood from the following detailed description of a preferred embodiment of the invention with reference to the drawings, in which:

FIG. 6 is a functional block diagram of a real-to-complex process for converting the real composite FDM signal into its corresponding complex representation.

DETAILED DESCRIPTION OF A PREFERRED EMBODIMENT OF THE INVENTION

Figure 1:
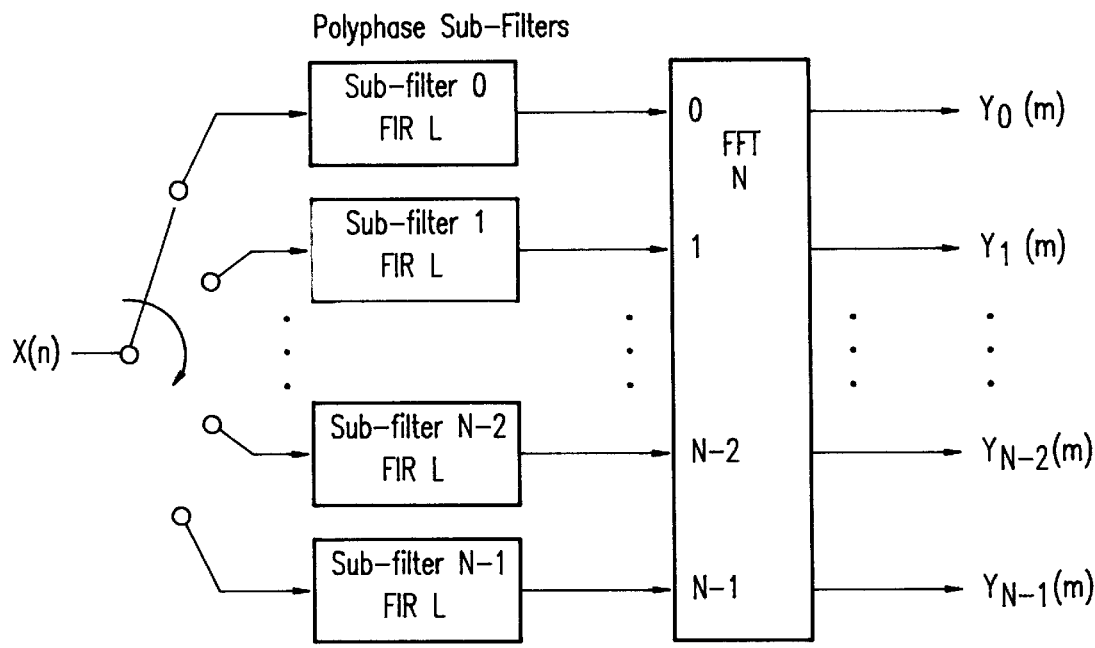
FIG. 1 is a functional block diagram of a prior art polyphase filter-fast Fourier transform (PPF-FFT) demultiplexer for an N channel FDM signal.
Figure 2:
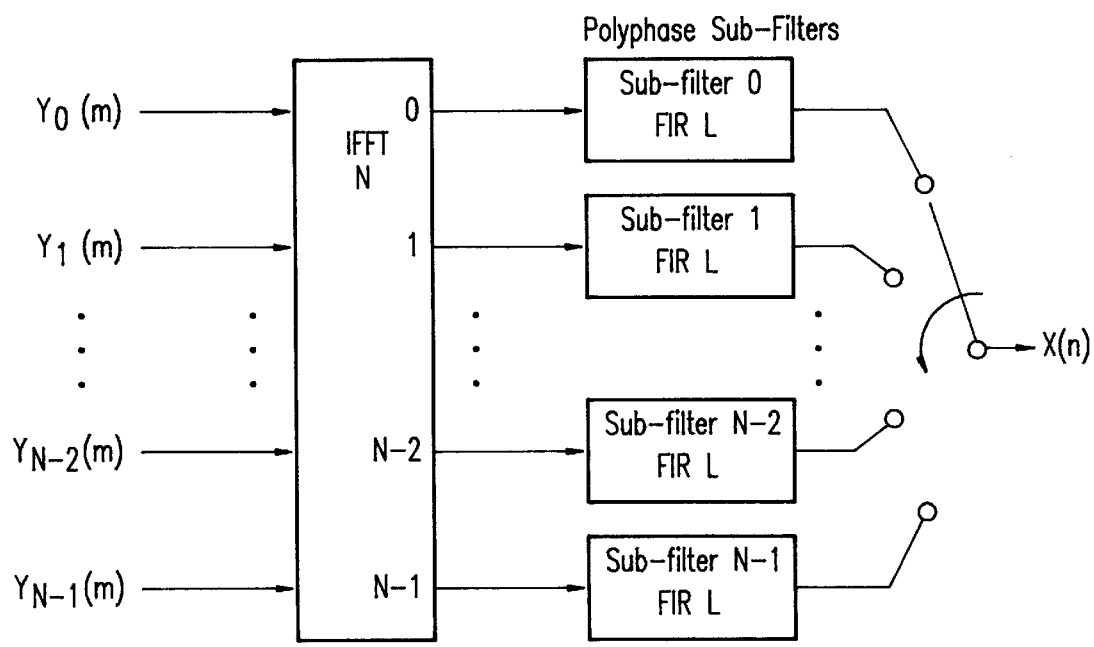
FIG. 2 is a functional block diagram of a prior art PPF-IFFT multiplexer for an N channel FDM signal.
Figure 3:
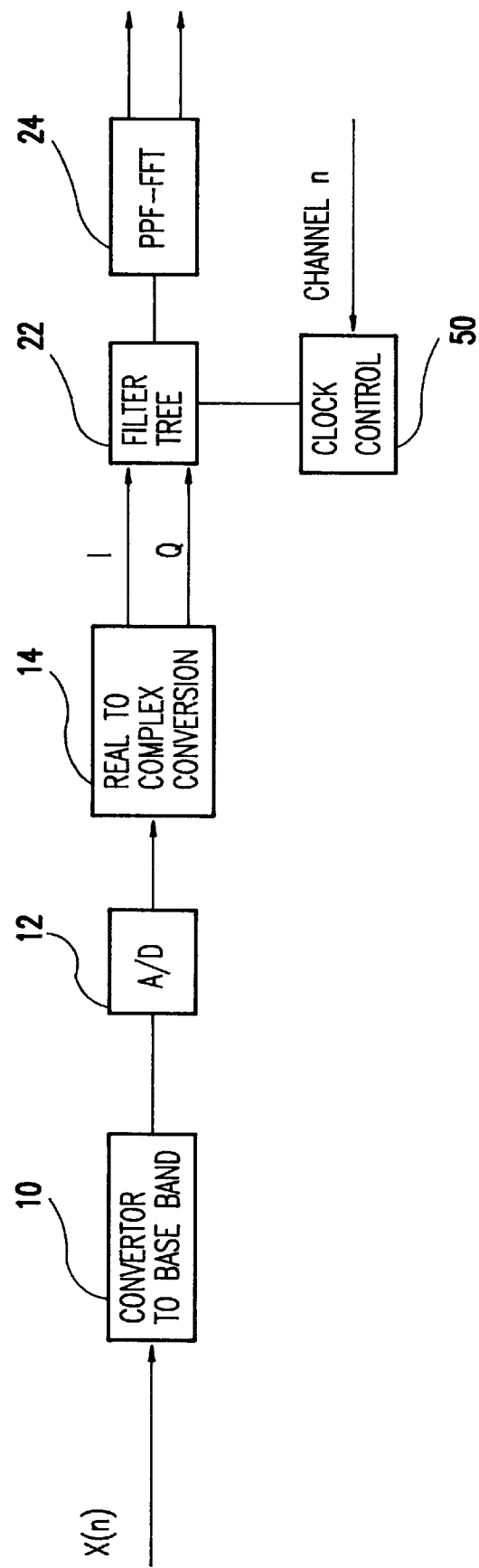
FIG. 3 is a simplified block diagram of an FDM demultiplexing system in accordance with the teachings of this invention.
Figure 4:
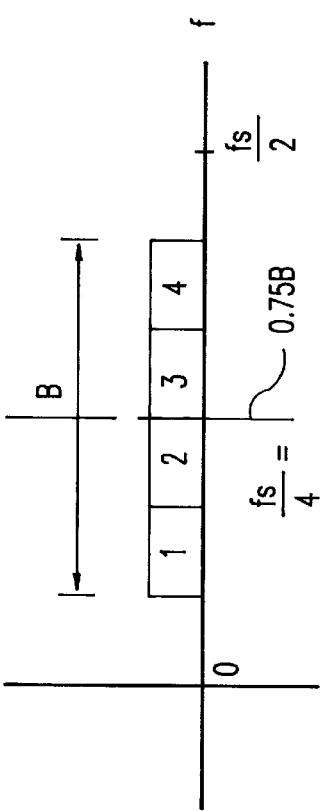
FIG. 4 is an idealized diagram illustrating a real, composite FDM signal with spectral offset from DC equal to one quarter of the signal bandwidth.

Referring now to FIGS. 3 and 4, an RF, N channel FDM signal $X_{(N)}$ of bandwidth B is coupled to the input of an RF to baseband convertor stage 10, which converts the received RF signal to a baseband signal off-set from DC by one quarter of the FDM band width B, as illustrated in FIG. 4. That is, the center frequency of the basebanded signal is located at a frequency equal to 0.75 of the bandwidth B. As will be appreciated by those skilled in the art, prior art digital multi-channel multiplex and demultiplex signal processing systems accept their composite input signals, consisting of up to N constituent FDM communications channels, centered at a practical baseband frequency. Due to imperfections in analog bandpass and anti-aliasing filtering and mixing (frequency downconversion), it is usually necessary to offset the basebanded composite signal band from DC. In accordance with the teachings of this invention, the composite signal's basebanded spectral location and sampling frequency are chosen to maximize the efficiency of the subsequent digital MCD/M signal processing. The real basebanded composite signals are inputted to the digital signal processing stages at a DC spectral offset of one quarter of the composite FDM signal bandwidth and, an analogue to digital convertor 12 samples the composite input signal at a frequency that is 50% higher than the applicable Nyquist rate. This quarter band spectral offset and oversampling by 50% above the theoretical Nyquist rate facilitate the use of computationally efficient bandshift and symmetric half-band FIR filtering operations to generate and subsequently process the corresponding analytic signal.

Figure 5:
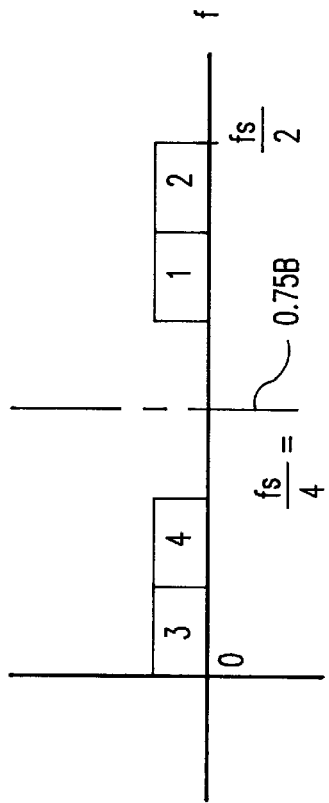
FIG. 5 is an idealized diagram illustrating the complex representation of the signal shown in FIG. 3.

A real-to-complex conversion processor 14 digitally generates a complex basebanded signal (illustrated in FIG. 5) in response to the over sampled, DC quarterband offset output of A/D convertor 12. A functional block diagram of processor 14 is shown in FIG. 6.

Referring now to FIG. 6, the real signal $x_n$ outputted from the A/D convertor 12 is coupled as an input to two multipliers 15 and 17 where the signal $x_n$ is multiplied by the functions $\cos(\pi/2)n$ and $-\sin(\pi/2)n$ respectively. The outputs of the multipliers 15 and 17 are coupled as inputs to identical, low order, symmetric, half-band, 2:1 decimating, finite impulse response (FIR) filters 18 and 20. The real and quadrature outputs $I_n$ and $Q_n$ of the filters 18 and 20 are coupled as inputs to a filter tree 22, whose outputs in turn are coupled to a PPF-FFT 24.

Here it should be noted, the architecture's unique combination of input signal spectral location and sampling rate substantially reduces the complexity of this processing. The processor 14 (shown in FIG. 6) generates a digital, complex baseband signal with a simple quarter band complex bandshift (requiring no actual multiples; the required function of multiplication by $\cos(\pi/2)n$ and $-\sin(\pi/2)n$ can be performed by simply outputting the input sample $X_n$, the input sample with its sign changed, $-X_n$, or zero as appropriate), followed by a low order symmetric half-band 2:1 decimating FIR filter. The signal thus generated is equivalent to the complex input signal that would have been obtained from sampling a corresponding alalog quadrature basebanded signal. The filter tree 22 and PPF-FFT 24 are designed to efficiently process this common, complex basebanded input signal.

Figure 7:
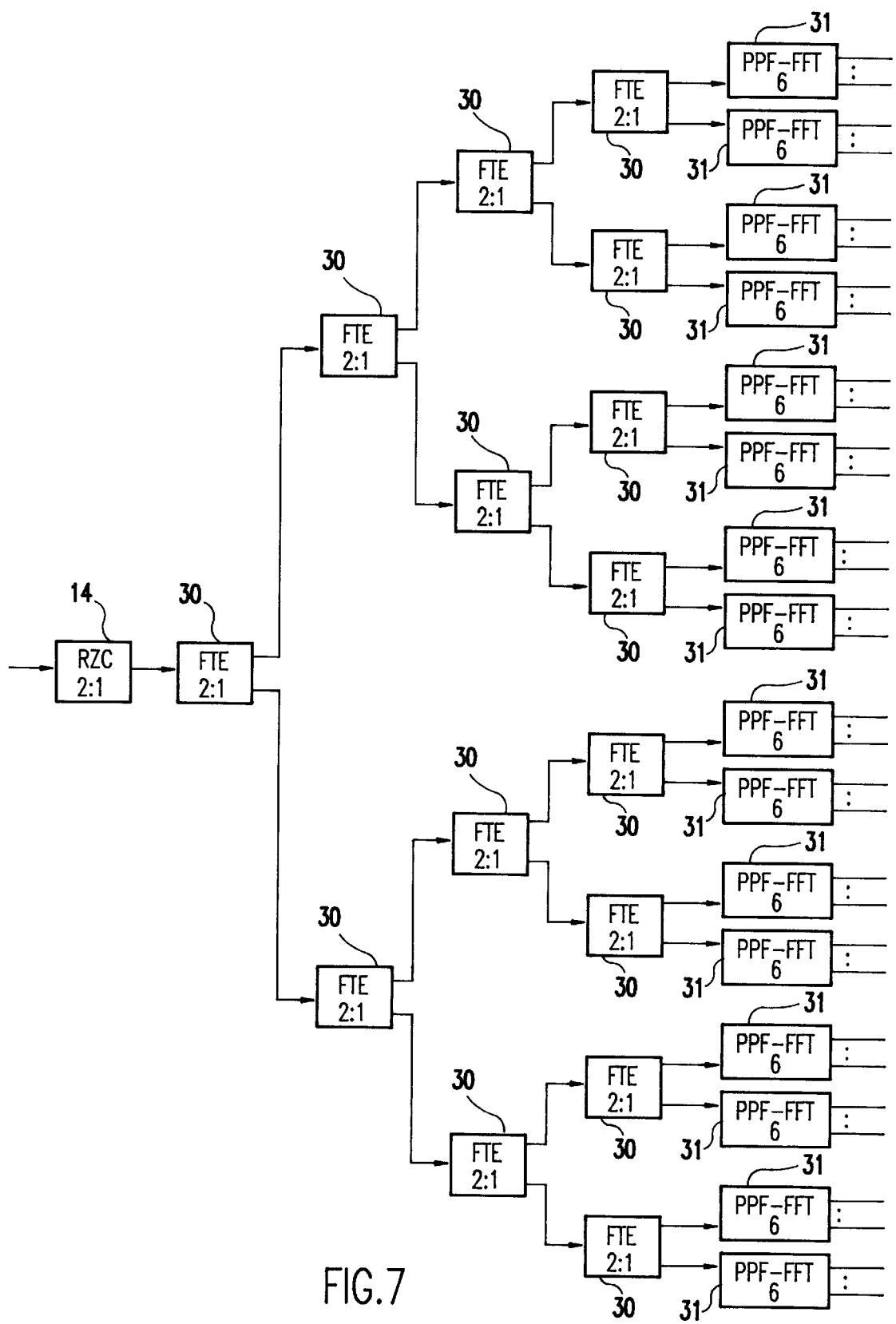
FIG. 7 is a functional block diagram of a filter tree and PPF-FFT demultiplexer stages in accordance with the teachings of this invention for a sixty-four channel FDM signal.

Referring now to FIG. 7 in addition to FIG. 3, the complex, basebanded composite signal from real to complex conversion processor 14 is processed by filter tree element (FTE) 30 through k stages of a band definition filtering and decimation to produce $2^k$ sub-band signals. In the illustrative embodiment of FIG. 7, k=4. Each sub-band signal is subsequently demultiplexed with an order $N'=3N/2^{k+1}$ PPF-FFT 31, where N is the order of the PPF-FFT structure that would have been required to demultiplex the original complex basebanded composite signal, without sub-band definition filtering, had it been sampled at the Nyquist rate.

The band definition filtering and decimation tree shown in detail in FIG. 7, is a tree-like structure of its serially concatenated Filtering Tree Elements (FTEs) 30. Each FTE 30 separates, and outputs, the lower and upper halves of its complex input signal's spectrum at half the input signal's sampling rate. At the output of the kth and final stage in the tree, the concatenated FTEs 30 have partitioned the original input signal band into $2^k$ sub-bands of equal bandwidth. Preferably, the smallest number of filtering tree stages, k, sufficient to ensure that the reduced (N') order sub-band PPF is physically realizable, is used. In this specific example, four stages (k=4) are used to produce a sub-band (N') PPF of order 6 to demultiplex composite signal consisting of 64 channels.

Figure 8:
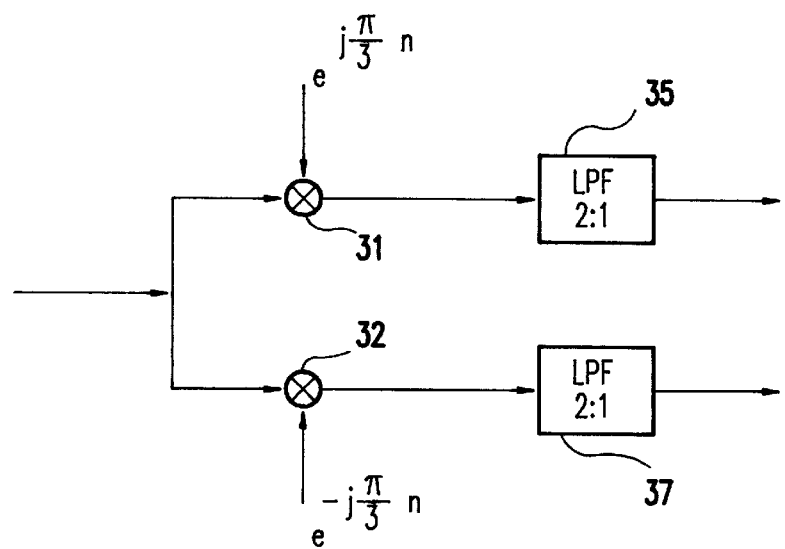
FIG. 8 is a functional block diagram of the Filter Tree Elements used in FIG. 7.

The spectral location and sampling rate of the input signal produced by the real-to-complex conversion processor 14 minimize the computational complexity of the FTE 30. The FTE 30 is shown in FIG. 8. Multipliers 31 and 32 respectively multiply the input by $$e^{j\frac{\pi}{3}n}$$

and $$e^{-j\frac{\pi}{3}n}$$

i.e. relatively simple positive and negative one-third band bandshifts (requiring an average of only 2 real multiples for every three complex input samples) followed by low order symmetric half-band 2:1 decimating FIR filters 35 and 37. FTE 30 is used throughout the band definition filtering and decimating tree—only the FTE's FIR coefficients change, and then only as necessary to meet filtering requirements uniquely encountered at the subject FTE's location.

Figure 9:
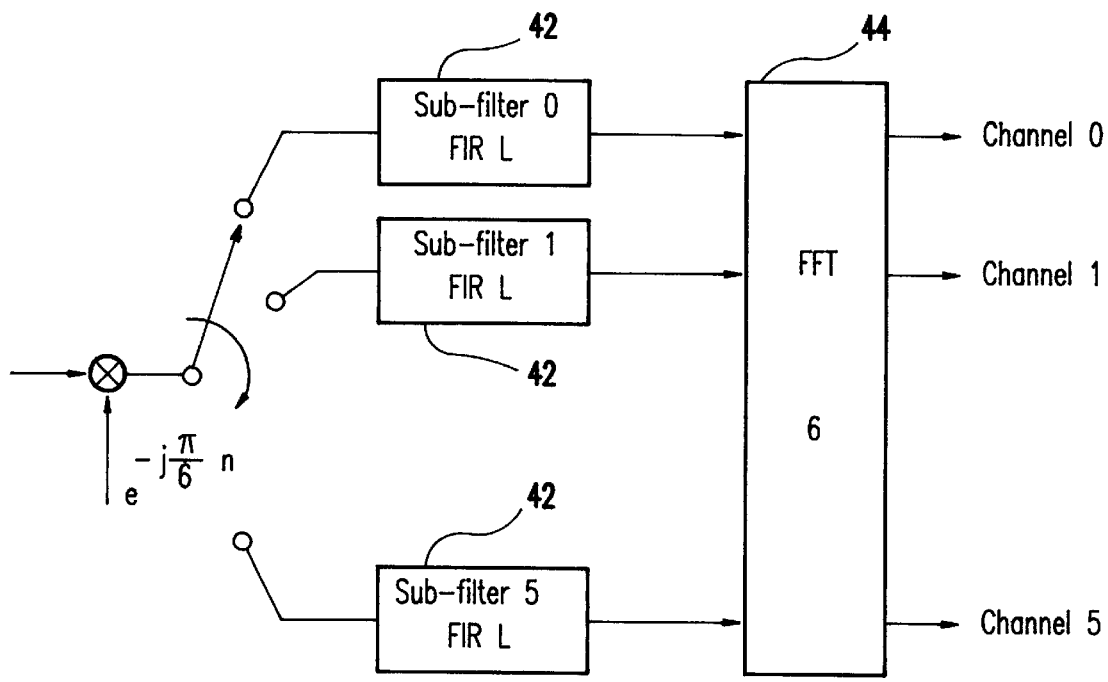
FIG. 9 is a functional block diagram of the final stage PPF-FFT 6 in FIG. 7.

The final stage FTEs 30 are coupled to an N' order PPF-FFTs 31 in order to demultiplex each sub-band and complete the demultiplexing process. In this specific exemplary embodiment of the invention, N'=6. As illustrated in FIG. 9, each PPF-FFT 31 is comprised of six polyphase subfilters 42 whose outputs are coupled on an N' point FFT 44, with N'=6.

Here, it should be noted that additional power can be saved by energizing only those FTEs 30 in the tree that are in a path for demultiplexing a channel of interest. For example, if the FTEs 30 are implemented in CMOS, control 50 disables the clock signal to the FTEs 30 in some or all paths, other than the path which includes the channel or channels of interest, in order to reduce power consumption.

The corresponding MCM architecture, as illustrated in FIGS. 10–13, is the mirror image, symmetric implementation of the MCD system described in conjunction with FIGS. 3–9, with the corresponding components in FIGS. 10–13 designated by same reference with a prime. The MCD architecture's FTE 2:1, PPF-FFT N', and R2C elements are replaced by their dual counterparts: the FTE 1:2, FFT-PPF N' and C2R elements, as shown in FIGS. 10–13 respectively, in the MCM architecture.

Figure 10:
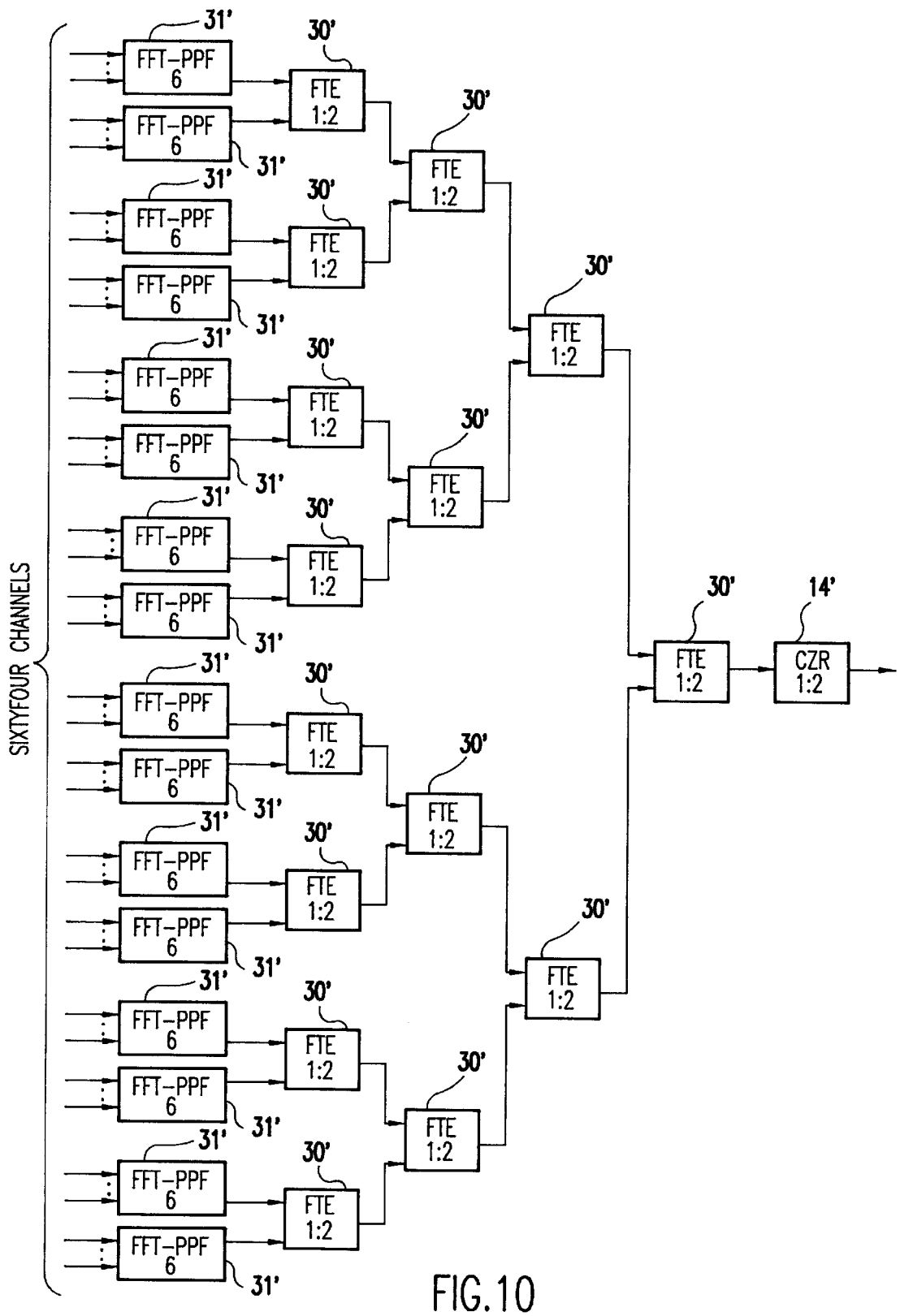
FIG. 10 is a functional block diagram similar to FIG. 7 of a multiplexer in accordance with the invention.
Figure 11:
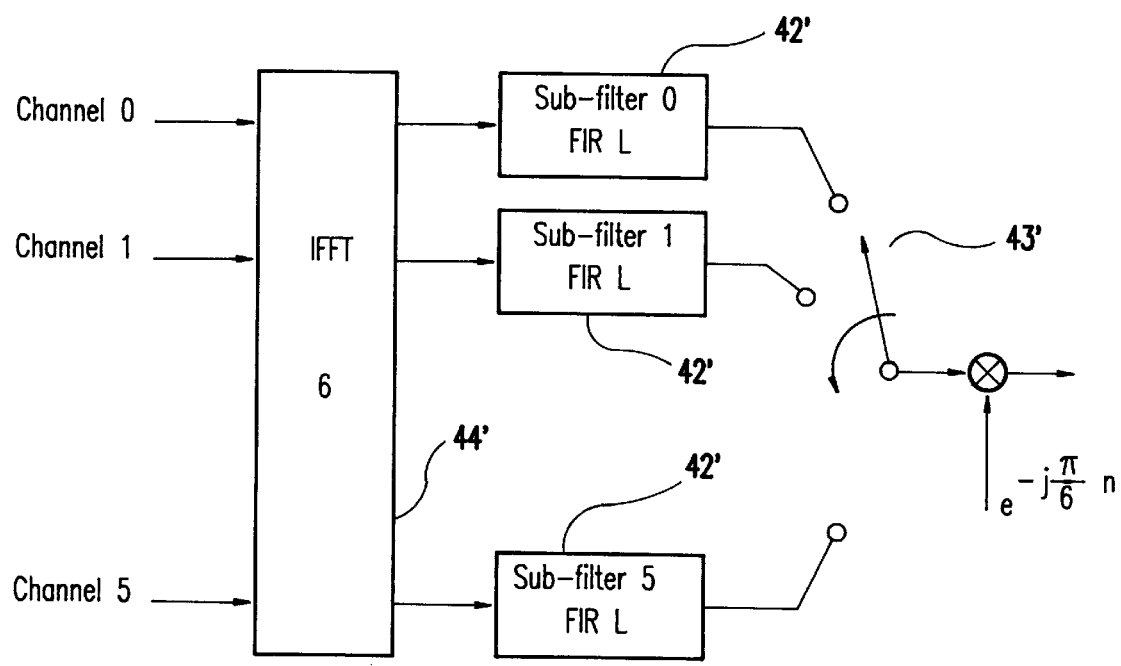
FIG. 11 is a functional block diagram of an IFFT-PPF element shown in FIG. 10.

Briefly, now referring to FIGS. 10 and 11, in this illustrative embodiment of the invention, sixty four digital signal channels, which are to be multiplexed, are coupled, in groups of six, to IFFT-PPFs 31'. The outputs of two IFFT-PPFs are inputs to the first stages of a filter tree comprised of filter tree elements 30'. Each IFFT-PPF 31' is comprised of a six point inverse fast Fourier transform processor 44' with each channel output filtered by a finite impulse response subfilter 42'. Multiplexing switch 43 couples the outputs of the subfilters 42' to the input of the filter tree element 30'. The filter tree in this illustrative embodiment of the invention has four stages. Each stage combines and outputs the lower and upper halves of the input signal spectrum at twice the input signal sampling rate.

Figure 12:
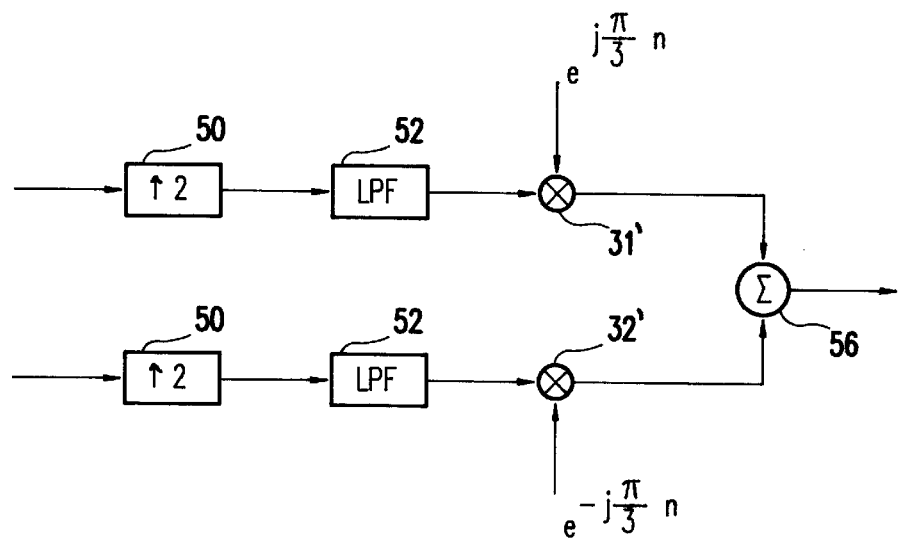
FIG. 12 is a functional block diagram of a Filter Tree Element shown in FIG. 10.

Referring now to FIG. 12, each filter tree element 30' is comprised of one-to-two interpolating stages 50, low pass filters 52, multipliers 31' and 32', and a summing junction 56. Multipliers 31' and 33' respectively multiply the input by $$e^{j\frac{\pi}{3}n}$$

and $$e^{-j\frac{\pi}{3}n}$$

relatively simple positive and negative one-third band bandshifts (requiring an average of only 2 real multiples for every three complex input samples).

Figure 13:
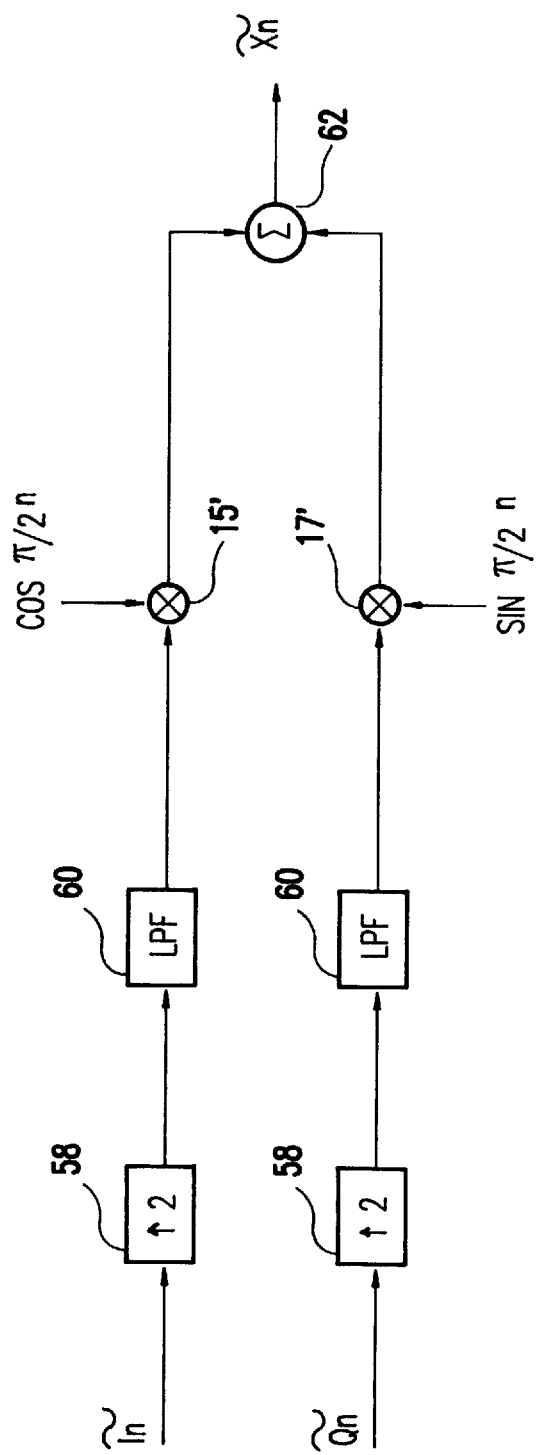
FIG. 13 is a functional block diagram of a complex to real process element shown in FIG. 10.

Referring now to FIG. 13, the final stage of the filter tree is coupled a complex to real conversion stage 14' comprised of one-to-two interpolating stages 58, low pass filters 60, multipliers 15' and 17', and summing junction 62. The output of the summing junction 62 is a real, digital, frequency division multiplexed signal of, in this illustrative example, the sixty four input channels.

These and other modifications may be made to the specific embodiment of the invention without departing from the spirit and scope of the invention.

I claim:

1. A method of demultiplexing an RF signal comprised of N frequency division multiplexed channels extending over a bandwidth B, including the steps of:

converting said RF signal to a baseband signal whose center frequency is offset from DC by an amount equal to three quarters of the bandwidth B;

converting said baseband signal to a digital signal at a sampling rate three times the bandwidth B;

generating a complex baseband digital signal by a quarterband complex bandshift of said digital signal and filtering the quarterband complex bandshifted signal with a two to one decimating, symmetric, half-band finite impulse filter;

dividing said complex digital signal into $2^k$ sub-bands by sub-band definition filtering in a k stage filter tree comprised of one third band bandshifters and two to one decimating, symmetric, half-band finite impulse response filters;

demultiplexing each of the $2^k$ outputs of the final stage of said k stage filter tree with an N' channel polyphase-fast Fourier transform (FFT) filter bank, where $N'=3N/2^k$.

2. A method of demultiplexing an RF signal comprised of N frequency division multiplexed channels extending over a bandwidth B as in claim 1, wherein said quarterband complex bandshift of said digital signal is accomplished by multiplication by plus 1, minus 1 or zero so that multipliers are not used and each third band bandshifter, used in the sub-band definition filtering tree, is effected with two real multiplies for every three complex input signal samples.

3. A method of demultiplexing an RF signal comprised of N frequency division multiplexed channels extending over a bandwidth B as in claim 1, wherein the number of stages, k, of said filtering and decimation tree is selected such that said dimension, N', of the resulting polyphase-FFT filter bank facilitates the realization of this structure within application imposed limits on implementation power and mass.

4. A method of demultiplexing an RF signal comprised of N frequency division multiplexed channels extending over a bandwidth B as in claim 1, wherein said digital demultiplexer is implemented in CMOS, and the digital logic clock signal is disabled in branches of the filtering and decimation tree which contain only inactive channels, thereby minimizing power consumption in applications exhibiting active channel sparsity.

5. A method of multiplexing N complex digital channel signals to synthesize a frequency division multiplexed signal extending over a bandwidth B, including the steps of:

multiplexing said N complex digital channel signals in $2^k$ groups of $N/2^k$ channels with an N' channel inverse fast Fourier transform (IFFT)-polyphase filter bank, where $N'=3N/2^{k+1}$ and the values of the central $N/2^{k+1}$ frequency bins are set equal to zero;

concentrating said $2^k$ groups of $N/2^k$ channels into a single frequency division multiplexed complex digital signal in a k stage filter tree comprised of one to two interpolating, symmetric, half-band finite impulse response filters, one third band bandshifters and a summation operation;

generating a real frequency division multiplexed digital signal by filtering said complex frequency division multiplexed digital signal with a one to two interpolating, symmetric, half-band, real finite impulse response filter and generating the real part of the quarterband complex bandshifted output of this filter.

6. A method of multiplexing N complex digital channel signals to synthesize a frequency division multiplexed signal extending over a bandwidth B as in claim 5, wherein said third band bandshifters, used in the k stage filter tree, are effected with two real multiplies for every three complex input signal samples, and said quarterband complex bandshift is accomplished without the use of multipliers.

7. A method of multiplexing N complex digital channel signals to synthesize a frequency division multiplexed signal extending over a bandwidth B as in claim 5, wherein the number of stages, k, of said filter tree is selected such that the dimension, N', of the resulting IFFT-polyphase filter bank facilitates the realization of this structure within application imposed constraints on implementation power and mass.

8. A method of multiplexing N complex digital channel signals to synthesize a frequency division multiplexed signal extending over a bandwidth B as in claim 5, wherein said digital multiplexer is implemented in CMOS, and the digital logic clock signal is disabled in those branches of said filter tree which contain no active channels, thereby minimizing power consumption in applications exhibiting active channel sparsity.

* * * * *

UNITED STATES PATENT AND TRADEMARK OFFICE
CERTIFICATE OF CORRECTION

PATENT NO : 5,867,479
DATED : Feb. 2, 1999
INVENTOR(S): Thomas C. BUTASH

It is certified that error appears in the above-identified patent and that said Letters Patent is hereby corrected as shown below:

In the drawings, Sheet 2, Fig. 3, X(n) should appear as X(t); and
  Sheet 4, Fig. 6, "sin $\pi/2$ n" should appear as -- -sin $\pi/2$ n--.

Col. 1, line 12, "polyphased" should read --polyphase--; and
    line 52, "these applications" should appear as --the applications in question--.
  Col. 2, line 3, the comma after "lightweight" should be deleted;
    line 39, "PPF-IFFT" should appear as --IFFT-PPF--;
    line 48, "3" should read --4--; and
    line 67, --conversion-- should be inserted before "process".
  Col. 3, line 4, "$X_{(N)}$" should appear as --X(t)--;
    line 5, --down-- should have been inserted before "convertor";
    line 7, "FDM band width" should appear as --FDM signal bandwidth--;
    line 9, "of" should appear as --times--;
    line 14, --intermediate-- should be inserted before "frequency";
    line 38, --functionally-- should be inserted before "coupled";
    line 39, "multiplied" should appear as --"multiplied"--.
    line 53, "required" should appear as --indicated--;
    line 59, "a" should appear as --the--; and
    line 60, "alalog" should appear as --analog--.

UNITED STATES PATENT AND TRADEMARK OFFICE
CERTIFICATE OF CORRECTION

PATENT NO : 5,867,479
DATED : Feb. 2, 1999
INVENTOR(S): Thomas C. BUTASH

It is certified that error appears in the above-identified patent and that said Letters Patent is hereby corrected as shown below:

Col. 4, line 2, "order" should be deleted; same line, --channel-- should be inserted before "PPF-FFT";
        line 3, "order" should appear as --dimension--;
        line 16, "(N') order sub-band" should appear as --dimension sub-band N' channel--;
        line 18, "(N') PPF" should be deleted;
        line 19, "of order 6 to demultiplex" should appear as --(N' = 6 channel) PPF to demultiplex a--;
        line 24, "32 respect-" should be deleted;
        line 25, "tively" should appear as --32, respectively, functionally--;
        line 32, "$\varepsilon$" should appear as --e--;
        line 35, "multiples" should appear as --multiplies--;
        line 39, "decimating" should appear as --decimation--;
        line 42, "order" should be deleted;
        line 43, "PPF-FFTs" should appear as --channel PPF-FFT--; and
        line 47, "on" should appear as --into--.
    Col. 5, line 1, "groups of six, to IFFT-PPFs 31'." should appear as --sixteen groups of four, to IFFT-PPFs 31' (the values of frequency bins 2 and 3 are set equal to zero).--;
        line 5, "channel" should be deleted.

UNITED STATES PATENT AND TRADEMARK OFFICE
CERTIFICATE OF CORRECTION

PATENT NO : 5,867,479
DATED : Feb. 2, 1999
INVENTOR(S) : Thomas C. BUTASH

It is certified that error appears in the above-identified patent and that said Letters Patent is hereby corrected as shown below:

Col. 5, line 6, --polyphase-- should be inserted after "response"; same line, "43" should appear as --43'--;
    line 10, "input" should appear as --output--;
    line 15, "33' respectively multiply" should appear as --33', respectively, (functionally) multiply--;
    line 21, "ε" should appear as --e--;
    line 25, "multiples" should appear as --multiplies--;
    line 28, --to-- should be inserted after "coupled".
    line 55, --and-- should be inserted after "filters";
    line 62, "by" should be deleted;
    line 63, "multiplication by plus 1, minus 1 or zero so that" should appear as --without the use of--; and
    line 64, "are not used" should be deleted.

Signed and Sealed this

Seventeenth Day of October, 2000

Attest:

Q. TODD DICKINSON

Attesting Officer

Director of Patents and Trademarks